(12) United States Patent
Wentzel

(10) Patent No.: US 10,145,864 B2
(45) Date of Patent: Dec. 4, 2018

(54) SENSORED ELECTRICAL JUMPER

(71) Applicant: 3M INNOVATIVE PROPERTIES COMPANY, St. Paul, MN (US)

(72) Inventor: Carl J. Wentzel, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 68 days.

(21) Appl. No.: 15/309,512

(22) PCT Filed: May 18, 2015

(86) PCT No.: PCT/US2015/031359
§ 371 (c)(1),
(2) Date: Nov. 8, 2016

(87) PCT Pub. No.: WO2015/179285
PCT Pub. Date: Nov. 26, 2015

(65) Prior Publication Data
US 2017/0184634 A1 Jun. 29, 2017

Related U.S. Application Data

(60) Provisional application No. 62/000,319, filed on May 19, 2015.

(51) Int. Cl.
*G01R 1/20* (2006.01)
*G01R 15/14* (2006.01)
(Continued)

(52) U.S. Cl.
CPC ......... *G01R 15/146* (2013.01); *G01R 15/142* (2013.01); *G01R 15/16* (2013.01); *G01R 15/06* (2013.01); *G01R 15/181* (2013.01)

(58) Field of Classification Search
CPC ......... H02J 7/0021; H02J 7/345; G06F 3/044; G06F 11/0766; G06F 11/0796;
(Continued)

(56) References Cited

U.S. PATENT DOCUMENTS 4,074,193 A 2/1978 Kohler
4,659,872 A 4/1987 Dery
(Continued)

FOREIGN PATENT DOCUMENTS

| EP | 2887074 | 6/2015 |
| JP | 4673698 | 4/2011 |
| WO | WO 2013/113954 | 8/2013 |

OTHER PUBLICATIONS

International Search Report for PCT International Application No. PCT/US2015/031359, dated Aug. 31, 2015, 3 pages.

*Primary Examiner* — Vinh Nguyen
(74) *Attorney, Agent, or Firm* — Gregg H. Rosenblatt

(57) ABSTRACT

A sensored electrical jumper comprises a conductor having a first end and a second end, the first end including a first connection interface and the second end including a second connection interface, a sensor section including at least one sensor disposed over the conductor between the first and second ends, the sensor section sensing at least one of current and voltage of the conductor, and a sensor output conduit extending from the sensor and oriented substantially perpendicular to the conductor axis to protect at least one sensor output wire from leakage current or other potential electrical damage.

19 Claims, 4 Drawing Sheets

(51) Int. Cl.
*G01R 15/16* (2006.01)
*G01R 15/06* (2006.01)
*G01R 15/18* (2006.01)

(58) Field of Classification Search
CPC .............. G01R 31/3658; G01R 31/026; G01R 15/146; G01R 19/00; G01R 19/0092; G01R 27/2605; G01R 31/025; G01R 31/086; G01R 31/2635; G01R 31/44; G01R 31/3631; G01M 5/0083; G01M 5/0033; G06K 19/0717; G06K 7/10366; H04N 21/6118; H04N 21/6168; H04N 1/00899; H04N 1/00901; G01D 11/24
See application file for complete search history.

(56) References Cited

U.S. PATENT DOCUMENTS

| | | | | |
|---|---|---|---|---|
| 4,963,819 A | * | 10/1990 | Clarke | G01R 15/16 174/73.1 |
| 5,017,859 A | * | 5/1991 | Engel | G01R 15/142 324/126 |
| 7,449,637 B2 | * | 11/2008 | Barth | G01R 15/146 174/88 C |
| 8,487,606 B2 | | 7/2013 | Juds et al. | |
| 9,742,180 B2 | * | 8/2017 | Wentzel | H02G 1/14 |
| 2006/0080831 A1 | | 4/2006 | Nguyen | |
| 2007/0115008 A1 | | 5/2007 | Barth et al. | |
| 2011/0006790 A1 | | 1/2011 | Kirkaune | |
| 2014/0063669 A1 | | 3/2014 | Lundqvist | |

* cited by examiner

SENSORED ELECTRICAL JUMPER

TECHNICAL FIELD

The invention relates to a sensored electrical jumper for medium and high voltage applications.

BACKGROUND

As electrical power distribution becomes more complex through the advent of renewable energy, distributed generation and the adoption of electric vehicles, intelligent electrical distribution and associated electrical sensing is becoming more useful and even necessary. Useful sensing may include, for example, voltage, current, and the time relationship between voltage and current at various locations within a power distribution network.

In implementing grid automation for the electrical grid, space constraints provide a challenge in implementing sensored devices for below grade and above grade locations.

SUMMARY

In general, this disclosure is directed to electrical jumpers for power cables and other medium and high voltage applications. In particular, sensored electrical jumpers described herein can be used in many electrical grid applications including replacing existing jumpers in underground, indoor, or outdoor applications, such as at switch locations, capacitor bank applications, metering cabinet applications, motors, switchgear, and overhead terminal/riser pole applications, replacing a terminal connection in an existing cable installation as well as terminal connections suitable for an initial installation, and for inserting between two splices for manholes and direct bury applications.

In one aspect, a sensored electrical jumper comprises a conductor having a first end and a second end, the first end including a first connection interface and the second end including a second connection interface, a sensor section including at least one sensor disposed over the conductor between the first and second ends, the sensor section sensing at least one of current, temperature and voltage of the conductor, and a sensor output conduit extending from the sensor and oriented substantially perpendicular to the conductor axis to protect at least one sensor output wire from leakage current or other potential electrical damage.

The above summary of the present invention is not intended to describe each illustrated embodiment or every implementation of the present invention. The details of one or more examples of this disclosure are set forth in the accompanying drawings and the description below. Other features, objects, and advantages of the disclosed techniques will be apparent from the description and drawings, and from the claims.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present disclosure describes a sensored electrical jumper for use in medium or high voltage power connection applications. The sensored electrical jumper utilizes integrated sensor technology. The jumper configurations described herein provide a compact mechanism for providing real time, high accuracy voltage and/or current characteristics of a power cable or location in an electrical grid. The device's compact design allows it to fit into confined spaces and to be retrofitted into existing systems. The sensored electrical jumper is designed to be used in underground, indoor, or outdoor applications, such as at switch locations, capacitor bank applications, metering cabinet applications, motors, switchgear, and overhead terminal/ riser pole applications, where reclosers, sectionalizers, capacitor banks, and primary metering are used. The sensored electrical jumper is particularly useful in distributed energy generation systems, in which devices can be geographically separated from each other. The sensored electrical jumpers can thus provide a utility, solar farm, wind farm, ship, industrial plant, or any individual or company that uses medium or high voltage equipment with the ability to create a smart node at many different grid locations.

Figure 1:
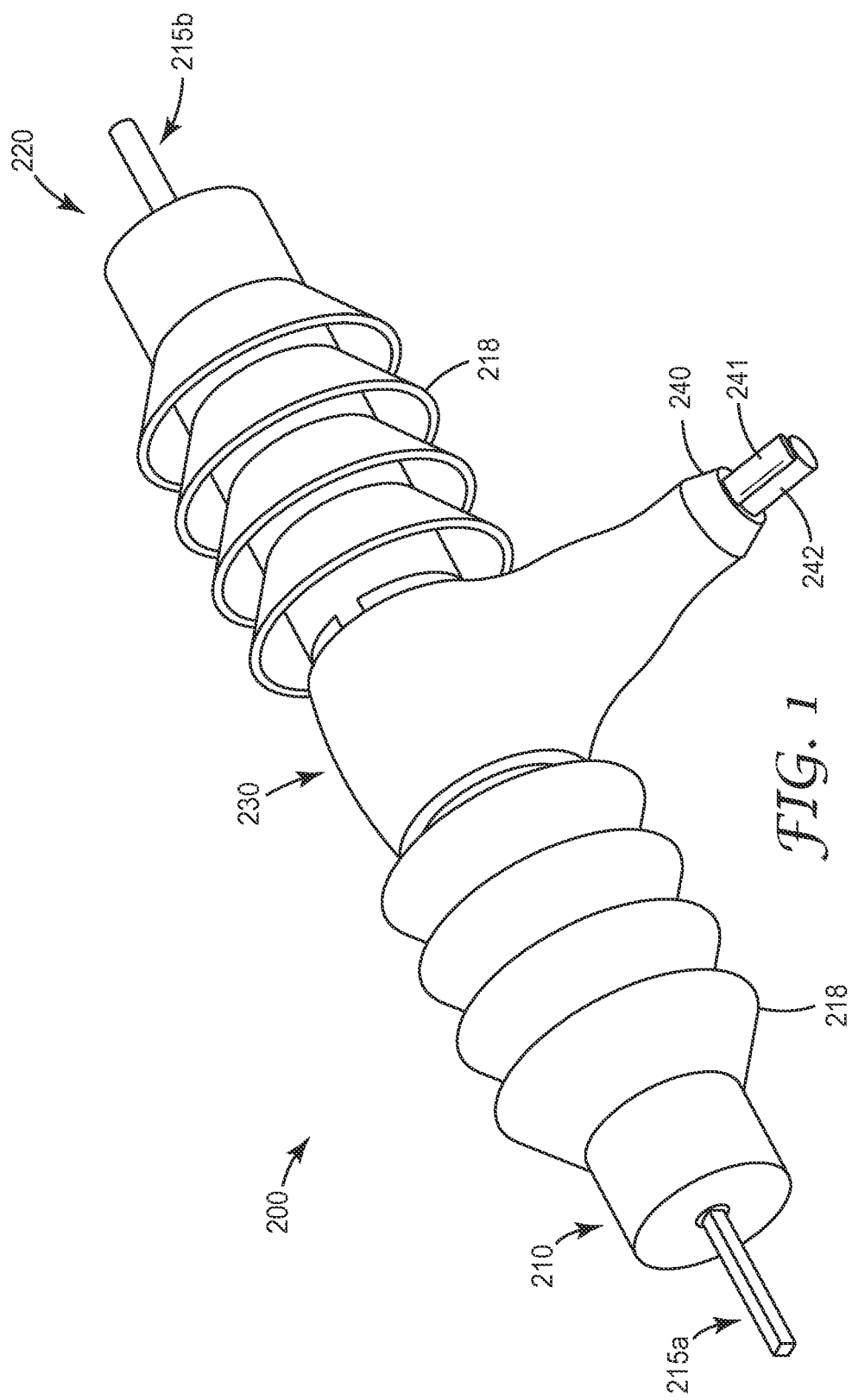
FIG. 1 is an isometric view of a sensored electrical jumper according to an aspect of the present invention.
Figure 2:
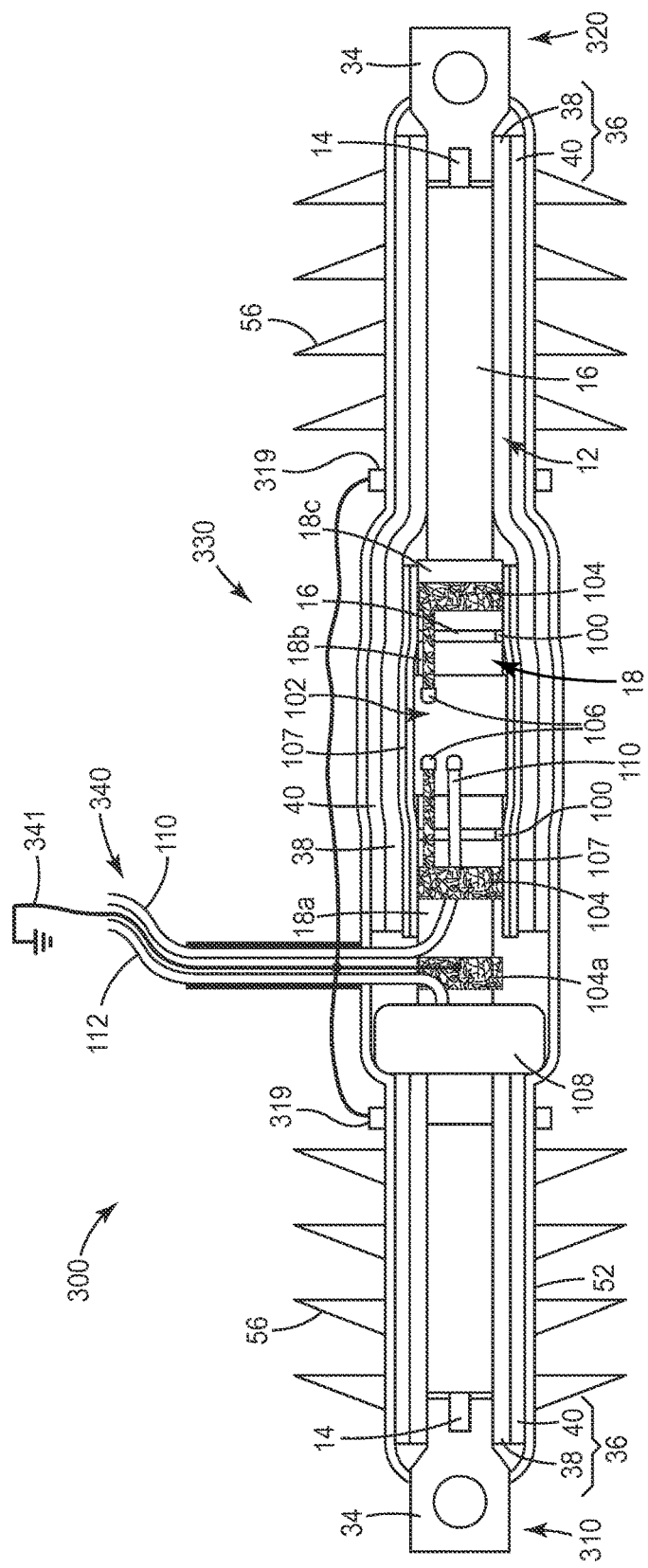
FIG. 2 is a schematic view of a sensored electrical jumper showing a partial cut away view of the sensor section according to another aspect of the invention.

In a first aspect of the invention, a sensored electrical jumper 200 is shown in FIG. 1. The sensored electrical jumper 200 includes a conductor (see e.g., cable 12 shown in FIG. 2 and conductor 1 shown in FIG. 3) having a first end and a second end. In alternative aspects, the conductor can be constructed as a solid piece of metal or a coaxial cable, such as a conventional medium or high voltage cable. The first end of the conductor includes a first connection interface 210 and the second end of the conductor includes a second connection interface 220. Each connection interface can be configured as, for example, a stem connector (such as shown in FIG. 1), a lug (such as shown in FIG. 2), a separable connector, a splice, a branch splice including any number of branches, and/or a modular connector. In an alternative aspect, a sensored jumper can include a first conductor end comprising a first type of connection interface and a second conductor end comprising a second, different type of connection interface, depending on the application (e.g., connection interface 210 can comprise a stem connector, and connection interface 220 can comprise a lug). In another aspect of the invention, each connection interface can comprise one or more separable connectors or a modular connector with two or more ends.

Figure 3:
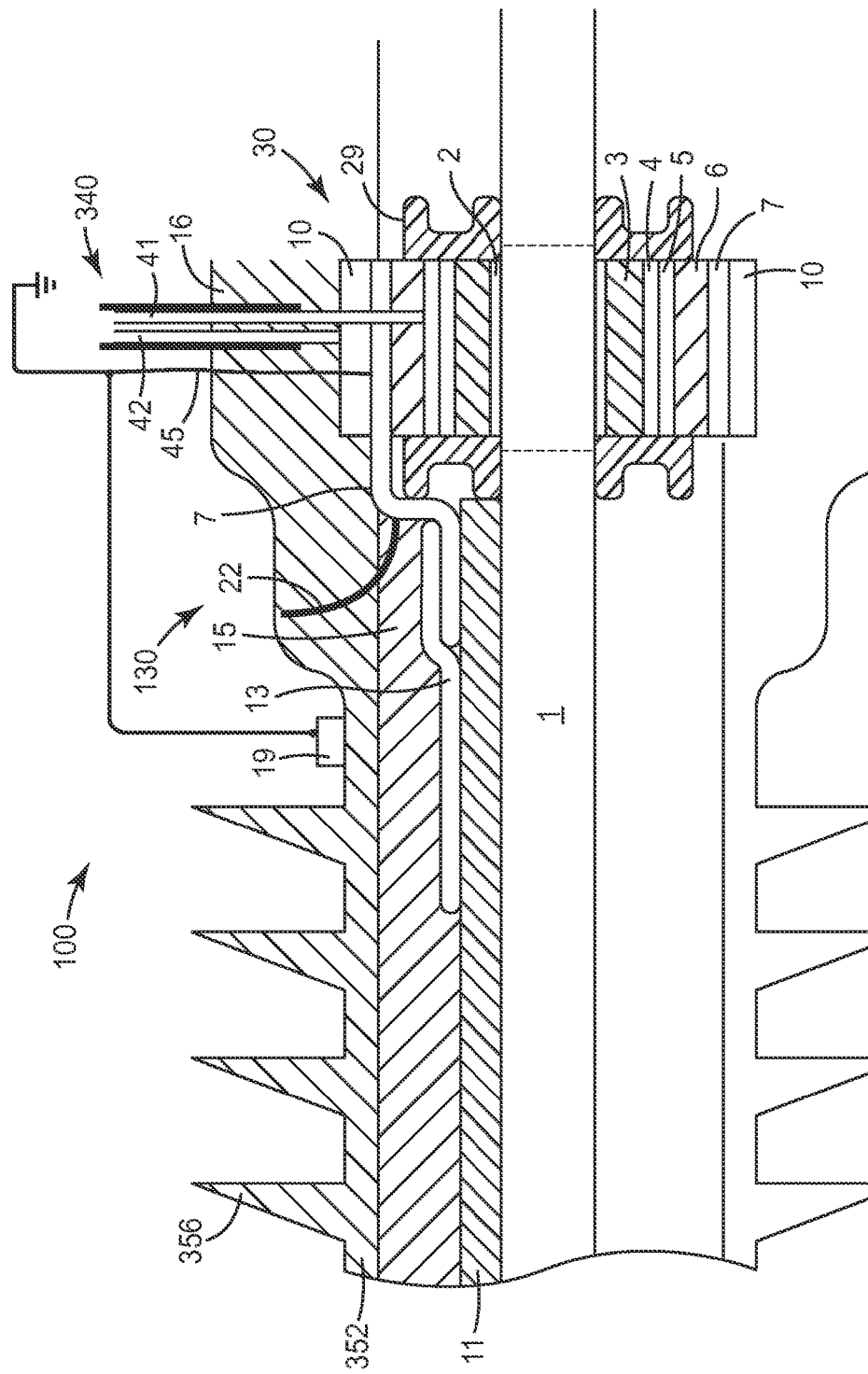
FIG. 3 is a partial cut away view of another sensored electrical jumper showing a partial cut away view of the sensor section according to another aspect of the invention.

A sensor section 230 includes a sensor disposed over the conductor between the first and second ends. As shown in the examples of FIGS. 2 and 3, the sensor can be configured to sense at least one of current, temperature and voltage. Different sensor constructions are provided in more detail below. In addition, the sensored electrical jumper 200 further includes a sensor output conduit 240 that extends from the sensor and is oriented substantially perpendicular to the conductor axis to protect at least one sensor output wire, such as output wire 242, from leakage current and other potential electrical damage. In addition, a jumper ground wire 241 can also be routed through sensor output conduit 240 to maintain ground potential. The jumper ground wire 241 will carry the fault current in case there is a flashover or fault so that the fuse or breaker feeding the sensored jumper will trip and eliminate the flow of current. In some aspects, sensor output conduit 240 can comprise a flexible conductive or nonconductive conduit.

As also shown in FIG. 1, the sensored electrical jumper 200 can include dielectric stress control features to mitigate the potential for leakage current and electrical failure. For example, the stress control features can be implemented as multiple skirts 218 protruding outward which serve to reduce leakage currents from the exposed stem connectors 215a and 215b. As mentioned above, the sensored electrical jumper can be used in underground, indoor, or outdoor applications, such as at switch locations, capacitor bank applications, metering cabinet applications, and overhead terminal/riser pole applications, where reclosers, sectionalizers, capacitor banks, and primary metering are used.

FIGS. 2 and 3 provide alternative configurations for the sensor construction utilized in the sensored electrical jumper. As would be apparent to one of skill in the art given the present description, other sensor configurations may also be implemented.

FIG. 2 is an alternate embodiment showing sensored electrical jumper 300. The sensored electrical jumper 300 includes a conductor that is configured as cable 12. Cable 12 includes an inner conductor 14, an insulation layer 16 surrounding inner conductor 14, and a conductive or semiconductor layer (hereinafter referred to as semiconductor layer) 18 surrounding insulation layer 16. In other aspects, additional layers of the cable 12, such as a metallic cable screen surrounding semiconductor layer 18 and an outer cable jacket surrounding the metallic cable screen may be removed. However, in some embodiments, these layers may remain on a portion of cable 12. The first end of the inner conductor 14 includes a first connection interface 310 and the second end of the inner conductor 14 includes a second connection interface 320. In this aspect, each connection interface can be configured as a lug 34.

In this embodiment, voltage and current sensors are integrated in sensor section 330. In the illustration of FIG. 2, insulating layer 16, semiconductive layer 18 of cable 12, as well as the sensors and some related elements are not shown in cross section. In addition, as shown in FIG. 2, a stress control tube 36, tubular sleeve 52, and insulating layer 107 are shown in cross section. In this aspect, stress control tube 36 comprising an inner High K layer 38 and an outer insulation layer 40 is mounted on the end portion of cable 12 adjacent lug 34 and extends along the sensored electrical jumper 300 such that it overlaps at least a portion of semiconductive layer 18 of cable 12. Stress control tube 36 can be made of a shrinkable material, such as silicone or EPDM. It may be heat or cold shrinkable material. In the embodiment of FIG. 2, sensored electrical jumper 300 further comprises a tubular sleeve 52 that extends over at least a portion of the conductor ends and the sensor section 330. Tubular sleeve 52 comprises an insulating layer of a shrinkable material, typically silicone or EPDM. It may be heat or cold shrinkable material. Alternatively, the sleeve 52 may be an overmolded or push-on layer. Optionally, in the illustrated embodiment, tubular sleeve 52 includes skirts 56 near the end portions of the jumper 300. The skirts serve to reduce leakage current, which is particularly useful for outdoor applications.

As shown in FIG. 2, annular strips of semiconductive layer 18 are removed to form non-conductive axial sections or gaps 100 in the semiconductor layer at which gaps the underlying insulation layer 16 is exposed. The portions of semiconductive layer 18 separated by gaps 100 are labeled 18a, 18b, and 18c for clarity. In an alternate embodiment, semiconductive layer 18 may terminate with portion 18a and pieces of a conductive or semiconductive material may be positioned on cable 12 to serve the same functions as portions 18b and 18c of semiconductive layer 18. In another alternate embodiment, a conductive or semiconductive material attached to the back of voltage sensor 102, prior to its attachment to interface cable 12, may be used in place of portion 18b of semiconductive layer 18. In yet another embodiment, voltage sensor 102 is attached directly to the insulation layer of cable 12.

As illustrated in FIG. 2, a voltage sensor 102 is placed on semiconductive layer portion 18b, which is electrically isolated from portions 18a and 18c by gaps 100. Although the present specification refers to attaching a sensor to cable 12, in some embodiments, the cable 12 itself functions as part of the sensor. In such instances, the reference herein to voltage sensor 102 refers to the portion of the sensor, e.g., a printed circuit board (PCB, not shown), which is attached to cable 12. In at least one embodiment of the present invention, the voltage sensor is a capacitive divider in which a first capacitor includes the cable inner conductor 14, the cable insulation layer 16, and semiconductive portion 18b. The second capacitor(s) are placed on a PCB, which is attached to semiconductive layer portion 18b. The inner electrical resistance of the semiconductive layer portion 18b is not significant.

In some examples, the PCB may be adapted to support a plurality of electronic components, which may serve other purposes, e.g. safety mechanisms for in case of ground fault and components that form electronic circuits for temperature compensation or additional sensing such as temperature, humidity, magnetic field, etc.

Strips of insulating material (not shown) cover gaps 100 to separate semiconductive portion 18b from any other conductive or semiconductive material or elements, except from the voltage sensor 102, and to prevent the presence of air in gaps 100, which air could cause a partial electrical discharge and a failure of voltage sensor 102. The insulating material may be any suitable material such as a combination of mastic, which will more easily fill gaps 100, and PVC tape placed over the mastic. The PVC tape may also serve the purpose of attaching the voltage sensor 102 to cable 12. Voltage sensor 102 measures the voltage of the inner conductor 14 of cable 12.

A ground plate of voltage sensor 102 is electrically connected (via e.g., grounding wire 341 which is connected to conductive element 104a) to one or both of semiconductive layer portions 18a and 18c by a conductive element 104. Conductive elements 104, 104a may comprise wire mesh that can be wrapped around one or both of semiconductive layer portions 18a and 18c. Conductive elements 104 can be soldered to a connection point 106 on voltage sensor 102. If the portion of conductive element 104 bridging from semiconductive layer portions 18a and 18c to the voltage sensor 102 are not insulated, the strips of insulating material (not shown) over gaps 100 will prevent it from making electrical contact with the underlying semiconductive portion 18b.

Insulation layer 107 covers voltage sensor 102 and the portions of semiconductive layer adjacent gaps 100. A layer of conductive or semiconductor material (not shown) is placed over insulation layer 107. In at least one embodiment, the layer of conductive or semiconductive material is combined with insulative layer 107 so that insulative layer 107 has an insulative layer facing the sensor and a layer of conductive or semiconductive material facing stress control tube 36. The conductive or semiconductive layer shields the sensor from external electrical fields. Stress control tube 36 covers insulation layer 107 and extends to the ends of cable 12 to which lugs 34 are attached. A current sensor 108 can also be included and can be positioned over semiconductive layer 18 adjacent to voltage sensor 102. Signal wire 110 is connected to voltage sensor 102 and signal wire 112 is connected to current sensor 108, which may be a Rogowski coil. Both wires 110, 112 are insulated so as not to cause any shorting. The voltage signal wire 110 and the current signal wire 112 exit the sensor section 330 of the sensored electrical jumper 300 via a sensor output conduit 340 (constructed in a manner similar to that described above) that extends from the sensor and is oriented substantially perpendicular to the conductor axis (e.g., the axis of inner conductor 14) to protect the sensor output wire(s), from leakage current and other potential electrical damage. In this aspect, ground wire 341 can exit separately from sensor output conduit 340. In addition, current collectors 319, such as metal straps, can be wrapped around sleeve 52 and connected to ground via ground wire 341 to collect leakage current and provide additional protection against flashover.

Both signal wires 110, 112 pass to the outside of sensored electrical jumper 300 where they may be connected to, for example, a remote terminal unit that processes current and or voltage data from the sensor section, or an integrator, a measuring device, a control device, or other suitable types of devices.

In at least one embodiment, voltage sensor 102 comprises a double sided flexible printed circuit board. In this aspect, the top or front of the PCB is the portion that faces insulative layer 107. The top of the PCB typically includes conductive features that are electrically connected to external devices. The bottom or back of the PCB faces cable 12. To establish the suitable electrical contact between sensor 102 and semiconductive layer portion 18b, it is desirable to maximize the contact area on the back of sensor 102. In alternative aspects, a copper foil or gold-plated copper foil can be utilized.

In other aspects, a patterned gold-plated copper layer can be utilized. The pattern may be formed in any suitable manner. For example, a photoresist process may be used to create the pattern by applying and developing a photoresist layer on the bottom copper layer of the circuit board (and optionally on portions of the top copper layer outside of the portion circuitized for the sensor to function) in a pattern that exposes areas of the copper layer to be removed to create the desired copper pattern. The exposed portions of the copper layer(s) may then be exposed to a copper etchant solution to remove the exposed areas of copper. The patterned photoresist is then removed, leaving a pattern of copper on the bottom side of the circuit board. A layer of nickel is then plated on the copper and gold or a gold alloy (sometimes referred hereinafter only as gold) is then plated on the nickel layer. The patterned gold-plated copper layer of the PCB ensures a good electrical connection between semiconductive layer portion 18b and the conductive vias of the PCB that connect to the electrical circuit elements on the top surface of the PCB. In one aspect, the output signals from the voltage sensor are low voltage. For example, the output signals from the voltage sensor can be on the order of about 1-10 Volts with a current on the order of microamperes.

Like a solid layer, a patterned gold-plated copper layer of this aspect of the present invention will provide a nearly infinite amount of contact points. The distance from one contact point to another is insignificant, as it is with a solid layer. The pattern created in the copper layer may be any suitable pattern, including but not limited to, a grid with a square or diamond shaped pattern. In addition, the voltage sensor PCB of this aspect can differ from standard PCBs in that standard PCBs have solder resist layers covering the front and back surfaces of the PCB, except for conductive areas at which electrical contact (typically by soldering) will be made.

In addition to the foregoing, mechanical stress applied to the PCB can be limited. The PCB is subject to mechanical stress when it is bent and placed around cable 12. Although this bent configuration may place some stress on the PCB, once it is affixed to cable 12, e.g., with a PVC tape, and especially after stress control tube 36 and tubular sleeve 52 are shrunk down around the interface cable 12, thereby applying a radial force to the PCB of voltage sensor 102, the flexible PCB remains in a relatively static state. Alternatively, stress control tube 36/sleeve 52 can be overmolded or pushed on to the jumper.

FIG. 3 is a schematic, partial cut-out view of a longitudinal section of a sensored electrical jumper 100, with the connection interface portions not shown, and the sensor section 130 shown in detail. The connection interface portions can be the same as described above. The sensor section 130 is disposed over a conductor 1, which can be a solid metal conductor, a bus bar, or a conventional power cable conductor.

The sensor 30 in this aspect is a combined voltage and current sensor. In this manner, space savings can be accomplished as the current sensor can be radially concentric with the voltage sensor. This configuration conserves space longitudinally, allowing jumper 100 to be shorter in length, which may be advantageous for some applications such as capacitor banks and metering cabinets. In addition, in this aspect of the invention, the voltage sensor can be formed using a temperature stable material.

The voltage sensor portion 29 has a tubular shape surrounding conductor 1. A tubular-shaped voltage sensing device may have a shape of a hollow cylinder. It may have the shape of a ring or a short tube. The voltage sensor portion 29 may have the shape of a bent or distorted tube. The voltage sensing device may have the shape of a rectangular tube, i.e. in a cross section, its outer profile may have the shape of a rectangle. The passageway may, for example, have a circular cross section, an elliptical or an oval cross section, or a rectangular or triangular or any angular or irregular cross section. In a specific embodiment, the outer shape of the voltage sensing device has the shape of a cylinder, and the passageway has a circular cross section and extends through the cylinder along the symmetry axis of the cylinder. The voltage sensor can have a construction similar to that described in EP Application No. EP 13198139.1, filed Dec. 18, 2013, incorporated by reference herein in its entirety.

The voltage sensor 29 includes an inner electrode or shield layer 2 in contact with conductor 1. The inner electrode 2 is disposed on a carrier element 3. The carrier element 3 comprises a radially-inner (or inner) surface on which the inner electrode 2 is arranged, and a radially-outer (or outer) surface on which an outer electrode or outer shield layer 4 is arranged. In this aspect, the carrier element 3 is solid, electrically non-conductive and comprises a material which has a coefficient of thermal expansion of less than $5\times10^{-6}$ l/K at 20° C. The carrier element 3 may, for example, comprise a ceramic material. Many ceramic materials have a coefficient of thermal expansion of less than $5\times10^{-6}$ l/K at 20° C. A low coefficient of thermal expansion may provide for an almost constant radial distance between the inner electrode and the outer electrode, when the temperature of the carrier element varies. This, in turn, may result in a lower variability with temperature of the capacitance of the sensing capacitor formed by the inner electrode, the outer electrode and the first portion of the carrier element. The overall accuracy of the voltage sensor is thereby improved, and/or the requirements to compensate for variations of the sensor output with temperature are relieved or even obsolete. Generally, a ceramic material further offers advantages in mechanical stability and electrical insulation properties.

In this aspect, the ceramic material can comprise silicon nitride ($Si_3N_4$). The coefficient of thermal expansion of this ceramic material is approximately $2.5\times10^{-6}$ l/K at a temperature of 20° C. When the voltage sensing device 29 and the carrier element 3 heat up, the carrier element 3 expands only by a very small amount, which results in the electrodes 2, 4 having almost the same radial distance, within a wide temperature range.

A plurality of lamellae (not shown) provide electrical contact between the conductor 1 and the inner electrode 2. A plurality of lamellae or ridges can provide for more contact points and thus for a better electrical connection. Also, a plurality of lamellae provide for a certain degree of redundancy, so that the contact between conductor 1 and inner electrode 2 is still present, even if one lamella breaks or fails.

The inner electrode 2 may comprise an electrically conductive metal, such as copper, silver, gold, nickel, aluminum, or an alloy comprising any of these materials. The inner electrode may comprise an electrically conductive polymer. Independent of other features, the radial thickness of the inner electrode may be between 1 micrometer and 1 millimeter. The inner electrode may comprise a non-ferromagnetic material, such as to transmit an electromagnetic field generated by the power-carrying conductor 1. It may, for example, comprise nickel-phosphor or an alloy comprising nickel-phosphor.

The outer electrode 4 of the voltage sensor 29 can comprises a nickel-phosphor plating, arranged on the outer surface of the carrier element 3. Nickel-phosphor provides a sufficient hardness and does not corrode quickly. It also facilitates soldering, so that a wire can be connected to the outer electrode 30 easily. An additional layer of gold may be provided for even better electrical conductivity. Generally, the outer electrode may comprise any suitable conductive material, such as copper, silver, or gold. In the conductor axial direction, the outer electrode 4 extends up to an outer electrode edge such that the path between the inner electrode edge and the outer electrode edge along the surface of the carrier element 3 has a length sufficient to considerably reduce the risk of surface breakdown between the electrodes 2, 4, when the voltage difference between the electrodes is in the medium- or high-voltage range, i.e. between 1 kilovolt and 110 kilovolts. In alternative aspects, the profile of the outer electrode 4 can be a straight line, i.e. all portions of the outer electrode 4 are radially equally close to the conductor axis, or the outer electrode 4 can have a curved profile with respect to the conductor axis.

The inner electrode 2 and the outer electrode 4 can be operated as two electrodes of a sensing capacitor. A middle portion of the carrier element 3 is arranged between the inner electrode 2 and the outer electrode 4. This middle portion can be operated as a dielectric of this sensing capacitor. The sensing capacitor can be connected in series with a secondary capacitor (PCB 5), similar to the PCB described above with respect to FIG. 2, so that the sensing capacitor and the secondary capacitor form a capacitive voltage divider. The capacitive voltage divider can then be used to sense the voltage of the inner conductor 1.

A printed circuit board (PCB) 5 is disposed on the outer electrode 4 of the voltage sensor 29. PCB 5 can comprise a double sided flexible printed circuit board. In this aspect, the top or front of the PCB 5 faces an insulation layer 6, radially disposed over PCB 5. The top of the PCB typically includes conductive features that are electrically connected to external devices via output signal wire 41. The bottom or back of the PCB 5 is disposed on outer electrode 4. To establish suitable electrical contact, it is desirable to maximize the contact area on the back of PCB 5. In alternative aspects, a copper foil or gold-plated copper foil can be utilized. In other aspects, a patterned gold-plated copper layer can be utilized.

Insulation layer 6 can comprise a conventional insulating material. The insulating material may be any suitable material such a combination of mastic, which will more easily fill gaps, and PVC tape placed over the mastic. The PVC tape may also serve the purpose of attaching the securing the PCB 5 to the outer electrode/carrier element.

Optionally, a further shielding layer 7 can be arranged concentrically around and disposed over the insulation layer 6. Shielding layer 7 can comprise a conventional conductive or semiconductive material and can be used to shield the insulation layer 6 and the body of carrier 3. As shown in FIG. 3, shielding layer 7 can extend axially along the axis of conductor 1 to surround a portion of insulation layer 11, which surrounds inner conductor 1 outside of the sensor section 30.

As mentioned above, the sensor 30 in this aspect comprises a combined voltage and current sensor. As shown in FIG. 3, a current sensor 10 surrounds the voltage sensor 29. This configuration conserves space along the axis of the conductor, allowing jumper 100 to be shorter in length for some applications. Current sensor 10 can be constructed similar to sensor 108 described above.

In this aspect, the current sensor 10 can be constructed as a Rogowski coil. The Rogowski coil can be used to sense a current through conductor 1. The Rogowski coil can be flexible and can be bent to conform circumferentially around the voltage sensor 29. The conductive turns of the actual coil are accommodated in a non-conductive envelope, which electrically isolates them from the outer electrode voltage sensor 29. The envelope can be preferably made of a flexible polymeric material. The carrier element 3 can include a recess that allows it to accommodate a current sensing device 10 without adding much to the outer diameter of the voltage sensing device 29. This allows the voltage sensing device 29 to be small in size.

The Rogowski coil detects the magnetic field generated by a current through the conductor 1 in the sensor section 130. Advantageously, the shielding layers can comprise electrically conductive, non-ferromagnetic material. Such material allows magnetic fields to be transmitted therethrough to the Rogowski coil. For example, the shielding layers, including the outer electrode, can comprise nickel-phosphor plating, which is non-ferromagnetic.

Output signals from the current sensor can be carried by current output signal wire 42.

As shown in FIG. 3, the sensored electrical jumper 100 can include a sensor output conduit 340 that extends from the sensor section through anti-tracking insulation layer 352 and is oriented substantially perpendicular to the conductor axis to protect the sensor output wires 41, 42 from leakage current and electrical damage. Sensor output conduit 340 can be constructed in a similar manner as described above.

In this aspect, a jumper ground wire 45 exits the sensor section 130 outside of sensor output conduit 340.

The sensored electrical jumper 100 further includes an insulation layer 11 surrounding the conductor 1 outside the sensor portion 130. The sensored electrical jumper 100 can further include a stress control layer 13 formed by a High K material. In one aspect, this stress control layer can be shaped as a tube that comprises in its mounted state an inner layer which is a stress control element and an outer dielectric layer 15 of e.g. silicone or ethylene propylene diene monomer rubber (EPDM). The stress control element may achieve stress control by the use of particular materials, such as High K materials or by the use of geometric stress control shapes. The stress control tube may be fabricated by a molding process or an extrusion process.

The sensored electrical jumper 100 further includes a tubular sleeve 352 that extends over at least a portion of the conductor ends and the sensor section 130. Tubular sleeve 352 comprises an anti-tracking insulation material that may be a heat or cold shrinkable material, an overmolded material or a push-on material. Optionally, tubular sleeve 352 may further include skirts near the end portions of the jumper 100. The skirts serve to reduce tracking current, which is particularly useful for outdoor applications.

In addition, current collectors 19, such as metal straps, can be wrapped around sleeve 16 and connected to ground via ground wire 45 to collect leakage current and provide additional protection against flashover. Optionally, for high voltage applications, deflectors 22, such as geometric stress cones formed in the outer sleeve 16, can also be implemented.

Because the sensored electrical jumpers described herein can include a current sensor and a capacitive voltage sensor, these devices facilitate calculation of phase angle (power factor), Volt Amps (VA), Volt Amps reactive (VAr), and Watts (W).

The sensored electrical jumper can be compact in size. For example, sensored electrical jumpers 100, 200, 300 can have an axial length of 25 inches or less.

The sensored electrical jumpers described herein can be utilized in a variety of applications. For example, for underground applications, such as in capacitor banks or in pad mounted, primary metering cabinets, which can include multiple current and potential transformers, a corresponding number of sensored electrical jumpers such as described herein can be utilized to enable cabinet manufacturers to decrease cabinet size and establish smart nodes for grid automation. For overhead applications, the sensored electrical jumpers described herein can be deployed with in-the-air equipment such as switches, on terminal/riser pole applications where terminations are connected to switches or fuses on the overhead lines. In addition, the sensored electrical jumpers can be utilized at locations having reclosers, sectionalizers, in-line tap pole installations, automatic transfer switch locations, and double deadend poles.

Figure 4A:
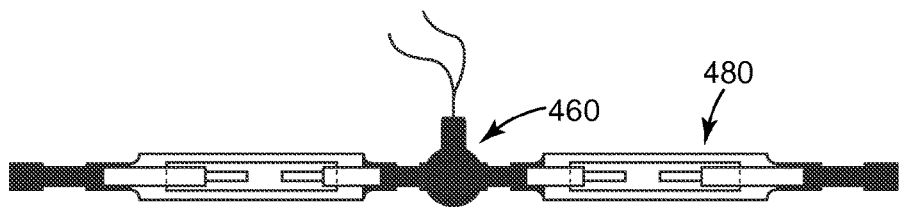
FIGS. 4A-4D show alternative implementations of the sensored electrical jumper according to alternative aspects of the present invention.
Figure 4B:
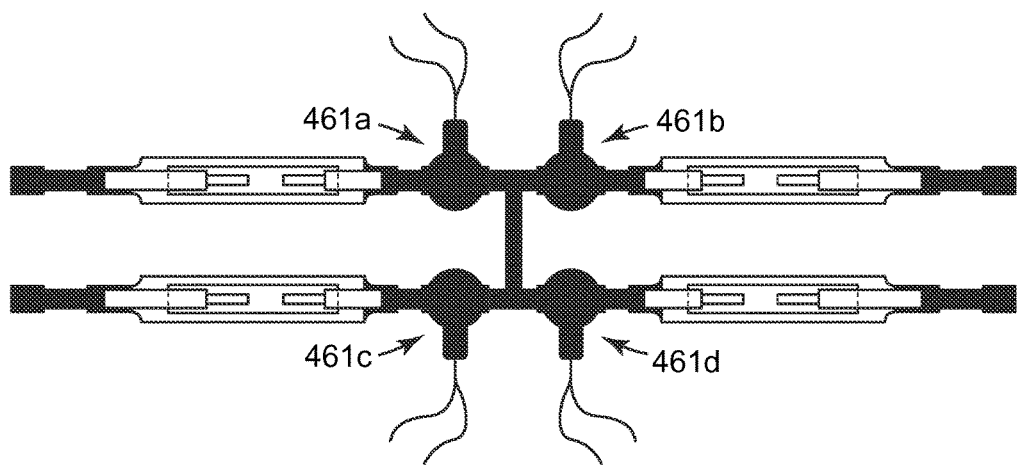
Figure 4C:
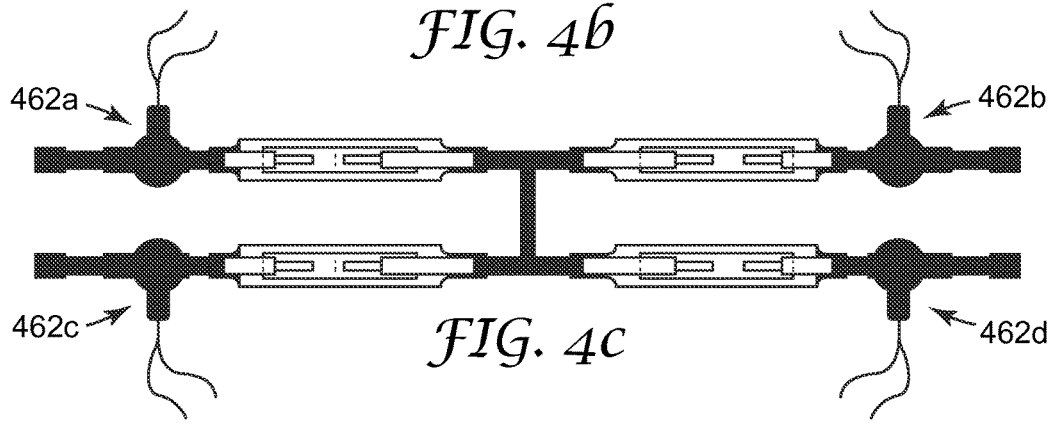
Figure 4D:
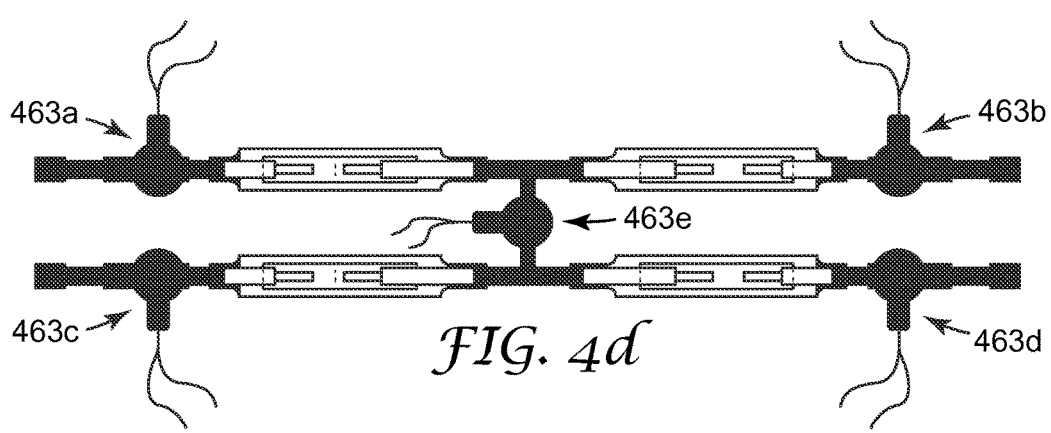

FIGS. 4A-4D show alternative implementations of the sensored electrical jumper described herein. For example, the sensored electrical jumpers can be includes as part of a splice, a branch splice, a separable splice, or a separable branched splice. For example, in FIG. 4A, a sensored electrical jumper 460 (which can be configured as described above with respect to jumpers 100, 200, 300) is employed as part of a separable sensored splice 480. In this implementation, the sensored electrical jumper 460 includes a semiconductive or conductive outer shell layer. In addition, the sensored electrical jumper can include a sensor section that comprises two or more ends. FIGS. 4B, 4C, and 4D show further alternative aspects of the sensored electrical jumper utilized as part of branch splices or separable branch splices that can be employed in manholes and vaults within the grid. For example, FIG. 4B shows four sensored electrical jumpers 461a-461d implemented as part of a separable sensored branch splice, allowing voltage and current measurements to be made at four different locations. In another alternative sensored branch splice implementation, as shown in FIG. 4C, four sensored electrical jumpers 462a-462d are provided as a sensored node having four connections, with voltage and/or current measurable at four locations. In a further aspect, FIG. 4d shows five sensored electrical jumpers, where sensored jumpers 463a-463d provide current data at four different locations and sensored jumper 463e can provide voltage data for the branch.

Although specific embodiments have been illustrated and described herein for purposes of description of the preferred embodiment, it will be appreciated by those of ordinary skill in the art that a wide variety of alternate or equivalent implementations may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein.

What is claimed is:

1. A sensored electrical jumper, comprising:
   a conductor having a first end and a second end, the first end including a first connection interface and the second end including a second connection interface,
   a sensor section including at least one sensor disposed over the conductor between the first and second ends, the sensor sensing at least one of current and voltage of the conductor, wherein the sensor includes a capacitive voltage sensor having an inner shield layer in contact with the conductor, an insulation layer disposed over the inner shield layer, and an electrically isolated outer shield layer disposed over the insulation layer,
   a stress control tube having a High K layer disposed over at least a portion of the sensor section, and
   a sensor output conduit extending from the sensor and oriented substantially perpendicular to the conductor axis to protect at least one sensor output wire from leakage current or other potential electrical damage.

2. The sensored electrical jumper of claim 1, wherein the sensor output conduit comprises a conductive flexible conduit having an outer insulation layer.

3. The sensored electrical jumper of claim 2, wherein the conductive flexible conduit comprises a metallic material.

4. The sensored electrical jumper of claim 1, wherein the electrically isolated outer shield layer comprises an electrically isolated section of conductive or semiconductive material.

5. The sensored electrical jumper of claim 4, wherein the electrically isolated section of conductive or semiconductive material forms an electrode of a capacitive voltage sensor.

6. The sensored electrical jumper of claim 1, wherein each connection interface comprises one of a lug, a stem connector, a separable connector, a splice, and a modular connector.

7. The sensored electrical jumper of claim 1, wherein the sensor section comprises a current sensor.

8. The sensored electrical jumper of claim 1, wherein the sensor section further comprises a current sensor.

9. The sensored electrical jumper of claim 8, wherein current sensor is at least partially concentric to the capacitive voltage sensor.

10. The sensored electrical jumper of claim 1, further including an outer sleeve comprising a tubular body formed from an anti-tracking insulation material.

11. The sensored electrical jumper of claim 10, wherein the outer sleeve further includes a plurality of skirts.

12. The sensored electrical jumper of claim 10, further including one or more current collectors disposed on the outer sleeve to collect leakage current.

13. The sensored electrical jumper of claim 10, further including a deflector portion formed in the outer sleeve proximate to the sensor output conduit.

14. The sensored electrical jumper of claim 1 having a length less than 25 inches.

15. The sensored electrical jumper of claim 1, wherein each connection interface comprises one or more separable connectors or a modular connector with two or more ends.

16. The sensored electrical jumper of claim 15, wherein the sensor section further comprises two or more ends.

17. The sensored electrical jumper of claim 15 disposed in a splice, branch splice, separable splice, separable connector, or separable branched splice.

18. The sensored electrical jumper of claim 1, wherein the sensor section further comprises a temperature sensor.

19. The sensored electrical jumper of claim 1, wherein the sensor output conduit comprises a nonconductive flexible conduit having an outer insulation layer.

* * * * *